United States Patent
Ong

(10) Patent No.: US 8,803,299 B2
(45) Date of Patent: Aug. 12, 2014

(54) STACKED INTEGRATED CIRCUIT PACKAGE SYSTEM

(75) Inventor: You Yang Ong, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 1381 days.

(21) Appl. No.: 11/307,904

(22) Filed: Feb. 27, 2006

(65) Prior Publication Data
US 2007/0200248 A1    Aug. 30, 2007

(51) Int. Cl.
*H01L 23/495*    (2006.01)

(52) U.S. Cl.
USPC ............ 257/676; 257/686; 438/123

(58) Field of Classification Search
USPC ........ 257/686, 777, 666, 676, 778, 675; 438/107, 110, 111, 112, 123, 124
See application file for complete search history.

(56) References Cited

U.S. PATENT DOCUMENTS

| | | | |
|---|---|---|---|
| 5,942,794 A | 8/1999 | Okumura et al. | 257/666 |
| 5,986,334 A | 11/1999 | Lee | 257/667 |
| 6,020,629 A | 2/2000 | Farnworth et al. | 257/686 |
| 6,075,284 A | 6/2000 | Choi et al. | 257/676 |
| 6,087,718 A * | 7/2000 | Cho | 257/686 |
| 6,222,259 B1 | 4/2001 | Park et al. | 257/690 |
| 6,337,510 B1 * | 1/2002 | Chun-Jen et al. | 257/666 |
| 6,559,525 B2 * | 5/2003 | Huang | 257/675 |
| 6,710,246 B1 * | 3/2004 | Mostafazadeh et al. | 174/528 |
| 6,743,696 B2 | 6/2004 | Jeung et al. | 438/458 |
| 6,836,009 B2 * | 12/2004 | Koon et al. | 257/692 |
| 6,984,881 B2 | 1/2006 | Takiar | 257/685 |
| 7,012,325 B2 * | 3/2006 | Ahn et al. | 257/678 |
| 7,151,013 B2 * | 12/2006 | Corisis et al. | 438/127 |
| 7,154,186 B2 * | 12/2006 | Noquil et al. | 257/778 |
| 7,208,821 B2 * | 4/2007 | Ha et al. | 257/666 |
| 7,227,249 B1 * | 6/2007 | Chiang | 257/686 |
| 2002/0153599 A1 * | 10/2002 | Chang et al. | 257/676 |
| 2002/0153600 A1 * | 10/2002 | Chang et al. | 257/676 |
| 2005/0287711 A1 | 12/2005 | Huang et al. | 438/123 |
| 2006/0003494 A1 | 1/2006 | Li | 438/124 |
| 2006/0008945 A1 | 1/2006 | Cady et al. | 438/109 |
| 2006/0102995 A1 * | 5/2006 | Tsai et al. | 257/686 |

* cited by examiner

*Primary Examiner* — S. V. Clark
(74) *Attorney, Agent, or Firm* — Ishimaru & Associates LLP

(57) ABSTRACT

A stacked integrated circuit package system is provided forming a lead and a die paddle from a lead frame, forming a first integrated circuit die having an interconnect provided thereon, placing a second integrated circuit die over the first integrated circuit die and the die paddle, connecting the second integrated circuit die and the lead, and encapsulating the first integrated circuit die and the second integrated circuit die with a portion of the lead and the interconnect exposed.

20 Claims, 9 Drawing Sheets

STACKED INTEGRATED CIRCUIT PACKAGE SYSTEM

TECHNICAL FIELD

The present invention relates generally to integrated circuit packages and more particularly to stacked integrated circuit package.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Numerous technologies have been developed to meet these requirements. Some of the research and development strategies focus on new package and integrated circuit technologies while others focus on improving the existing package and integrated circuit technologies. Research and development in the existing technologies may take a myriad of different directions. One proven way to reduce cost is to use technologies with existing manufacturing methods and equipments.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has also shifted to packaging as a means to fulfill the relentless demands for enhanced system performance.

As multi-die and package stacking migrate towards system in a package (SIP) integration, integrated circuits of different technologies as well as the same technologies are packed into a single package. Modern integrated circuits and packaging solutions must operate in a single environment forcing both integrated circuit and packaging technologies to offer different functions while reducing package size.

In response to the demands for improved packaging, many innovative package designs have been conceived and brought to market. The multi-chip module has achieved a prominent role in reducing the board space. But stacking integrated devices, package-in-package, or combination thereof has system level difficulties.

Thus, a need still remains for the stacked integrated circuit package system providing multi-function, low package height, and low cost manufacturing. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit package system including forming a lead and a die paddle from a lead frame, forming a first integrated circuit die having an interconnect provided thereon, placing a second integrated circuit die over the first integrated circuit die and the die paddle, connecting the second integrated circuit die and the lead, and encapsulating the first integrated circuit die and the second integrated circuit die with a portion of the lead and the interconnect exposed.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
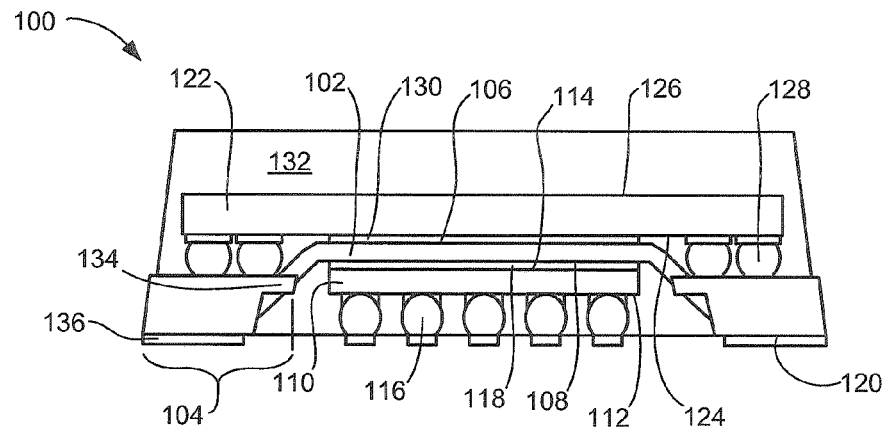
FIG. 1 is a cross-sectional view of a first stacked integrated circuit package system in an embodiment of the present invention.

In the following description, numerous specific details are given to provide a thorough understanding of the invention.

However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, there is shown a cross-sectional view of a first stacked integrated circuit package system 100 in an embodiment of the present invention. A die paddle 102 and leads 104 are formed from a lead frame. The die paddle 102, having a paddle top 106 and a paddle bottom 108, is half-etched and punched up above the leads 104. Inner leads 134, the inner portions of the leads 104, may be formed by a number of processes, such as half etching, to remove some material from the lower surfaces of the leads 104.

A first integrated circuit die 110, such as a logic, power, or radio frequency (RF) device, has a first active side 112 and a first non-active side 114. The first active side 112 has circuitry and first interconnects 116, such as solder bumps, balls, or pillars, thereon. The first non-active side 114 attaches to the paddle bottom 108 of the die paddle 102 with a first adhesive 118, such as a solder paste adhesive or a nonconductive adhesive (NCA). Bottoms of the first interconnects 116 and lead bottoms 120 of the leads 104 are substantially in the same horizontal plane.

A second integrated circuit die 122, such as a logic device, has a second active side 124 and a second non-active side 126. The second active side 124 has circuitry and second interconnects 128, such as solder bumps, balls, or pillars, thereon. An inner area of the second active side 124 attaches on the paddle top 106 of the die paddle 102 with a second adhesive 130. The second interconnects 128 are at the boundary of the second active side 124 and attach to the leads 104.

The die paddle 102 provides dual side die-attach surfaces with the paddle top 106 and the paddle bottom 108. The die paddle 102 may serve as RF shield and may made from copper (Cu) doped with Beryllium.

An encapsulation 132 may be molded on the first integrated circuit die 110, the die paddle 102, the second integrated circuit die 122, and the second interconnects 128. The leads 104 are partially covered by the encapsulation 132 with the lead bottoms 120 exposed from a bottom of the encapsulation 132 for connections to the next system level (not shown), such as a printed circuit board. The inner leads 134 provide registration in the encapsulation 132. The first interconnects 116 are also partially covered by the encapsulation 132 and exposed from the bottom of the encapsulation 132 for connections to the next system level. The exposed surfaces of the lead bottoms 120 and the first interconnects 116 are plated with a stand-off plating 136. The first interconnects 116 forms shorter connection paths for the first integrated circuit die 110, since the first active side 112 is down, facing the bottom of the encapsulation 132 thus reducing electrical parasitics and allowing faster signal transmission.

It has been discovered that the present invention provides a low package height for stacking multiple integrated circuits of same, similar, or different functions and technologies while providing high input/output (IO) count in a minimal surface area. The height of the first stacked integrated circuit package system 100 may be around 0.5 mm with the first integrated circuit die 110 and the second integrated circuit die 122 thinned to 2 to 5 mils. The die paddle 102 provides a dual-side die-attach surfaces as well as serve as an RF shield between the first integrated circuit die 110 and the second integrated circuit die 122. Full utilization of the package bottom plane provides a dense 10 count. The first integrated circuit die 110 and the second integrated circuit die 122 connecting at an inner area of a package bottom and through the leads 104 at the boundary, respectively, of the first stacked integrated circuit package system 100 provide the high 10 count.

Figure 2:
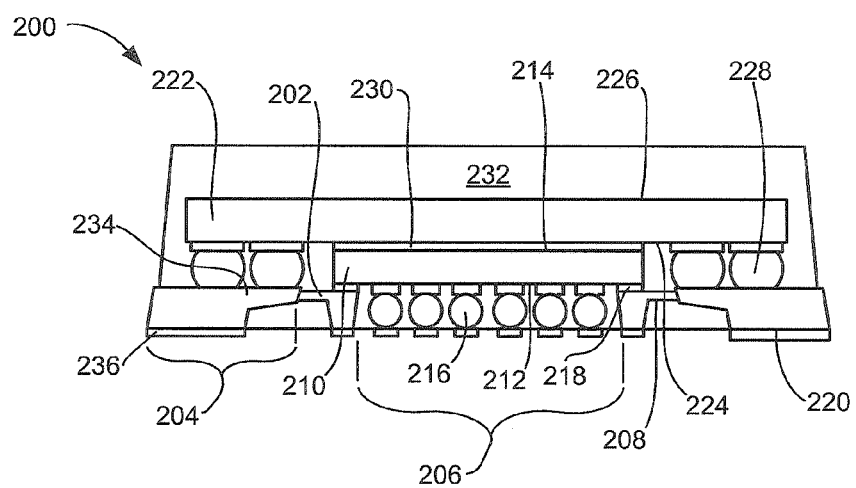
FIG. 2 is a cross-sectional view of a second stacked integrated circuit package system in an alternative embodiment of the present invention.

Referring now to FIG. 2, there is shown a cross-sectional view of a second stacked integrated circuit package system 200 in an alternative embodiment of the present invention. A die paddle 202 and leads 204 are formed from a lead frame. A center cavity 206 is formed by removing the center part of the die paddle 202. A paddle recess 208 is formed by removing, such as half etching, some materials of the die paddle 202 between the outer peripheral portion of the die paddle 202 and the portion near the center cavity 206. Inner leads 236, the inner portions of the leads 204, may be formed by a number of processes, such as half etching, to remove some material from the lower surfaces of the leads 204. The die paddle 202 extends into an interior of the second stacked integrated circuit package system 200 more than the leads 204.

A first integrated circuit die 210, such as a logic, or memory device, has a first active side 212 and a first non-active side 214. The first active side 212 has circuitry and first interconnects 216, such as solder bumps, balls, or pillars, thereon. A peripheral area of the first active side 212 attaches to the die paddle 202 with a first adhesive 218, such as a thixotropic adhesive, over the center cavity 206. The first interconnects 216 are in the center cavity 206. Bottoms of the first interconnects 216 and lead bottoms 220 of the leads 204 are substantially in the same horizontal plane.

A second integrated circuit die 222, such as a logic device, has a second active side 224 and a second non-active side 226. The second active side 224 has circuitry and second interconnects 228, such as solder bumps, balls, or pillars, thereon. An inner area of the second active side 224 attaches on the first non-active side 214 of the first integrated circuit die 210 with a second adhesive 230. The second interconnects 228 are at the boundary of the second active side 224 and attach to the leads 204.

An encapsulation 232 covers the first integrated circuit die 210, the second integrated circuit die 222, and the second interconnects 228. The die paddle 202 is partially covered by the encapsulation with a portion forming the center cavity 206 exposed for optional connection to the next system level (not shown), such as a printed circuit board. The leads 204 are also partially covered by the encapsulation 232 with the lead bottoms 220 exposed for connections to the next system level. The paddle recess 208 and the inner leads 236 provide registration in the encapsulation 232. The first interconnects 216 are also partially covered by the encapsulation 232 and exposed for connections to the next system level. The exposed surfaces of the die paddle 202, the lead bottoms 220, and the first interconnects 216 are plated with a stand-off plating 236. The first interconnects 216 forms shorter connection paths for the first integrated circuit die 210 reducing electrical parasitics and allowing faster signal transmission.

It has been also discovered that the present invention provides a low package height for stacking multiple integrated circuits of same, similar, or different functions and technologies while providing high input/output (IO) count in a minimal surface area. The height of the second stacked integrated circuit package system 200 may be around 0.5 mm with the first integrated circuit die 210 and the second integrated circuit die 222 thinned to 2 to 5 mils. The die paddle 202 having the center cavity 206 provides mounting surfaces for the first integrated circuit die 210 as well as providing space for the first interconnects 216 without imposing additional height requirements. Full utilization of the package bottom plane provides a dense IO count. The first integrated circuit die 210 and the second integrated circuit die 222 connecting through the center cavity 206 and through the leads 204 at the boundary, respectively, of the second stacked integrated circuit package system 200 provide the high IO count.

Figure 3:
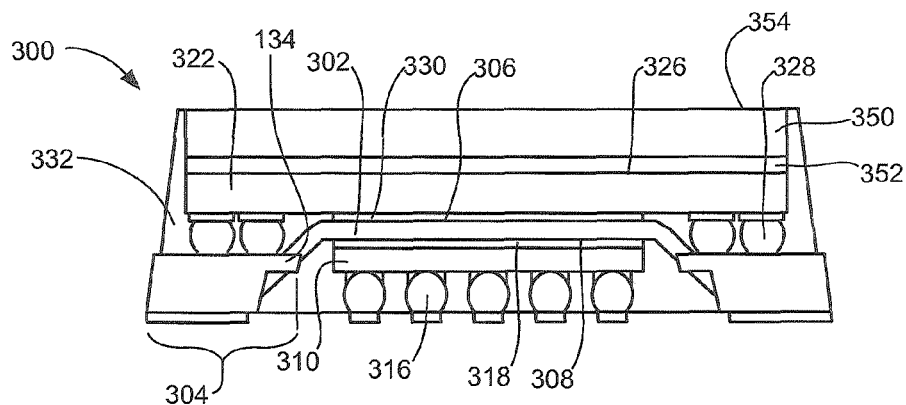
FIG. 3 is a cross-sectional view of a third stacked integrated circuit package system having a heat slug in another alternative embodiment of the present invention.

Referring now to FIG. 3, there is shown a cross-sectional view of a third stacked integrated circuit package system 300 having a heat slug 350. The third stacked integrated circuit package system 300 is similar in structure to the first stacked integrated circuit package system 100 of FIG. 1 including a die paddle 302 having a paddle bottom 308 and a paddle top 306, leads 304, a first integrated circuit die 310, and a second integrated circuit die 322 in an encapsulation 332. The first integrated circuit die 310 attaches to the paddle bottom 308 with a first adhesive 318. First interconnects 316, such as solder bumps, balls, or pillars, of the first integrated circuit die 310 are exposed. The second integrated circuit die 322 attaches to the paddle top 306 with a second adhesive 330. Second interconnects 328, such as solder bumps, balls, or pillars, of the second integrated circuit die 322 are on the leads 304.

The heat slug 350 attaches on a second non-active side 326 of the second integrated circuit die 322 with a thermal adhesive 352. The encapsulation 332 partially covers the heat slug 350 exposing a slug top surface 354 to ambient.

Figure 4:
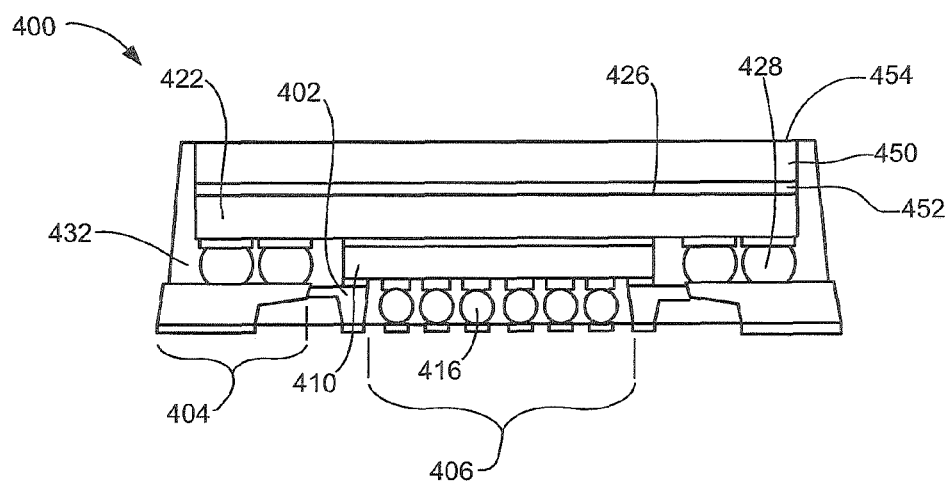
FIG. 4 is a cross-sectional view of a fourth stacked integrated circuit package system having a heat slug in yet another alternative embodiment of the present invention.

Referring now to FIG. 4, there is shown a cross-sectional view of a fourth stacked integrated circuit package system 400 having a heat slug 450 in yet another alternative embodiment of the present invention. The fourth stacked integrated circuit package system 400 is similar in structure to the second stacked integrated circuit package system 200 of FIG. 2 including a die paddle 402 having a center cavity 406, leads 404, a first integrated circuit die 410, and a second integrated circuit die 422 in an encapsulation 432. The first integrated circuit die 410 is on the die paddle 402 and over the center cavity 406. First interconnects 416, such as solder bumps, balls, or pillars, are in the center cavity 406 are exposed. The second integrated circuit die 422 on the first integrated circuit die 410 with second interconnects 428, such as solder bumps, balls, or pillars, on the leads 404.

The heat slug 450 attaches on a second non-active side 426 of the second integrated circuit die 422 with a thermal adhesive 452. The encapsulation 432 partially covers the heat slug 450 exposing a slug top surface 454 to ambient.

Figure 5:
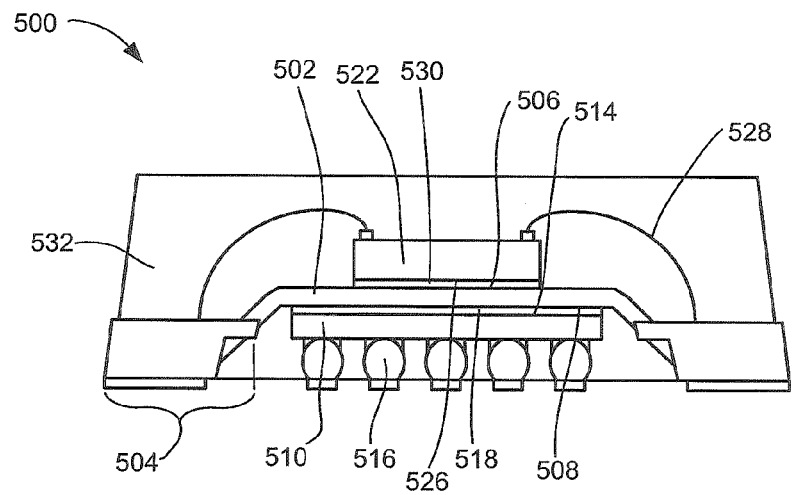
FIG. 5 is a cross-sectional view of a fifth stacked integrated circuit package system in yet another alternative embodiment of the present invention.

Referring now to FIG. 5, there is shown a cross-sectional view of a fifth stacked integrated circuit package system 500 in yet another alternative embodiment of the present invention. The fifth stacked integrated circuit package system 500 is similar in structure to the first stacked integrated circuit package system 100 of FIG. 1 including a die paddle 502 having a paddle bottom 508 and a paddle top 506, leads 504, and a first integrated circuit die 510 in an encapsulation 532. A first non-active side 514 of the first integrated circuit die 510 attaches to the paddle bottom 508 with a first adhesive 518. First interconnects 516, such as solder bumps, balls, or pillars, of the first integrated circuit die 510 are exposed.

The fifth stacked integrated circuit package system 500 also includes a second integrated circuit die 522 and provides a hybrid interconnect configuration. A second non-active side 526 of the second integrated circuit die 522 attaches on the paddle top 506 with a second adhesive 530. Second interconnects 528, such as bond wires, connect between the second integrated circuit die 522 and the leads 504. The encapsulation 532 also covers the second integrated circuit die 522 and the second interconnects 528. The hybrid interconnect configuration minimize wire crossing with the bond wires at a different tier than the solder bumps.

Figure 6:
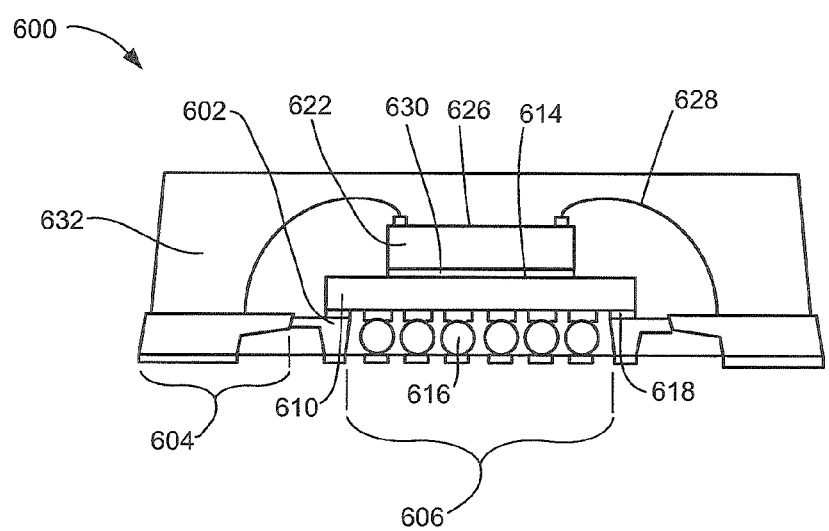
FIG. 6 is a cross-sectional view of a sixth stacked integrated circuit package system in yet another alternative embodiment of the present invention.

Referring now to FIG. 6, there is shown a cross-sectional view of a sixth stacked integrated circuit package system 600 in yet another alternative embodiment of the present invention. The sixth stacked integrated circuit package system 600 is similar in structure to the second stacked integrated circuit package system 200 of FIG. 2 including a die paddle 602 having a center cavity 606, leads 604, and a first integrated circuit die 610 in an encapsulation 632. The first integrated circuit die 610 attaches to the die paddle 602 with a first adhesive 618 and over the center cavity 606. First interconnects 616, such as solder bumps, balls, or pillars, of the first integrated circuit die 610 are in the center cavity 606 and exposed.

The sixth stacked integrated circuit package system 600 also includes a second integrated circuit die 622 and provides a hybrid interconnect configuration. A first non-active side 614 of the first integrated circuit die 610 attaches to a second non-active side 626 of the second integrated circuit die 622 with a second adhesive 630. Second interconnects 628, such as bond wires, connect between the second integrated circuit die 622 and the leads 604. The encapsulation 632 also covers the second integrated circuit die 622 and the second interconnects 628. The hybrid interconnect configuration minimize wire crossing with the bond wires at a different tier than the solder bumps.

Figure 7:
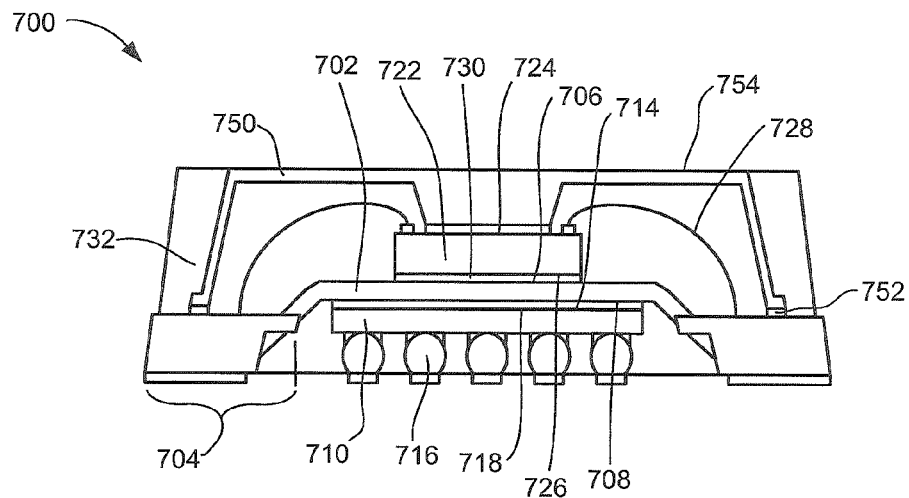
FIG. 7 is a cross-sectional view of a seventh stacked integrated circuit package system having a heat slug in yet another alternative embodiment of the present invention.

Referring now to FIG. 7, there is shown a cross-sectional view of a seventh stacked integrated circuit package system 700 having a heat slug 750 in yet another alternative embodiment of the present invention. The seventh stacked integrated circuit package system 700 is similar in structure to the fifth stacked integrated circuit package system 500 of FIG. 5 including a die paddle 702 having a paddle bottom 708 and a paddle top 706, leads 704, a first integrated circuit die 710 and a second integrated circuit die 722 in an encapsulation 732.

A first non-active side 714 of the first integrated circuit die 710 attaches to the paddle bottom 708 with a first adhesive 718. First interconnects 716, such as solder bumps, balls, or pillars, of the first integrated circuit die 710 are exposed. A second non-active side 726 of the second integrated circuit die 722 attaches on the paddle top 706 with a second adhesive 730. Second interconnects 728, such as bond wires, connect between the second integrated circuit die 722 and the leads 704. The hybrid interconnect configuration minimize wire crossing with the bond wires at a different tier than the solder bumps.

The heat slug 750 attaches on a second active side 724 of the second integrated circuit die 722 and on the leads 704 with a thermal adhesive 752. The encapsulation 732 partially covers the heat slug 750 exposing a slug top surface 754 to ambient.

Figure 8:
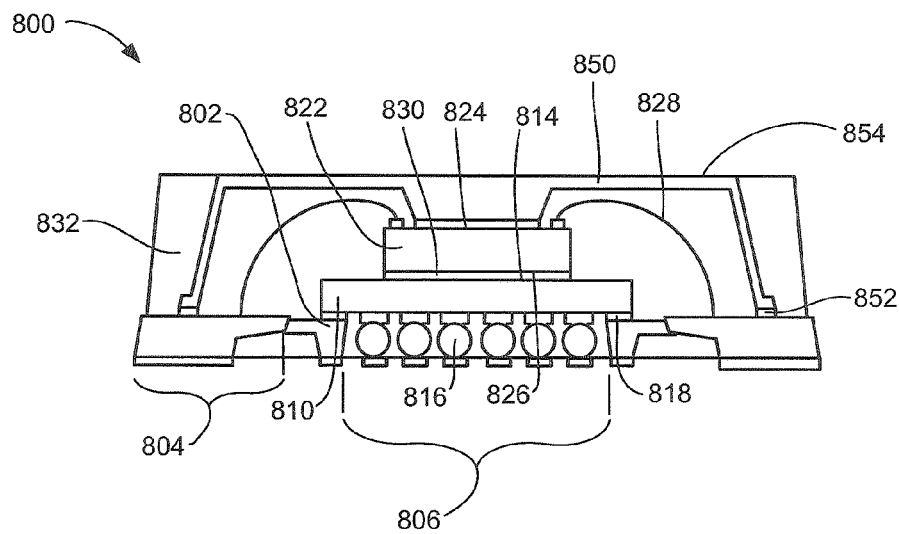
FIG. 8 is a cross-sectional view of an eighth stacked integrated circuit package system having a heat slug in yet another alternative embodiment of the present invention.

Referring now to FIG. 8, there is shown a cross-sectional view of an eighth stacked integrated circuit package system 800 having a heat slug 850 in yet another alternative embodiment of the present invention. The eighth stacked integrated circuit package system 800 is similar in structure to the sixth stacked integrated circuit package system 600 of FIG. 6 including a die paddle 802 having a center cavity 806, leads 804, a first integrated circuit die 810, and a second integrated circuit die 822 in an encapsulation 832.

The first integrated circuit die 810 attaches to the die paddle 802 with a first adhesive 818 and over the center cavity 806. First interconnects 816, such as solder bumps, balls, or pillars, of the first integrated circuit die 810 are in the center cavity 806 and exposed. A first non-active side 814 of the first integrated circuit die 810 attaches to a second non-active side 826 of the second integrated circuit die 822 with a second adhesive 830. Second interconnects 828, such as bond wires, connect between the second integrated circuit die 822 and the leads 804. The hybrid interconnect configuration minimize wire crossing with the bond wires at a different tier than the solder bumps.

The heat slug 850 attaches on a second active side 824 of the second integrated circuit die 822 and on the leads 804 with a thermal adhesive 852. The encapsulation 832 partially covers the heat slug 850 exposing a slug top surface 854 to ambient.

Figure 9:
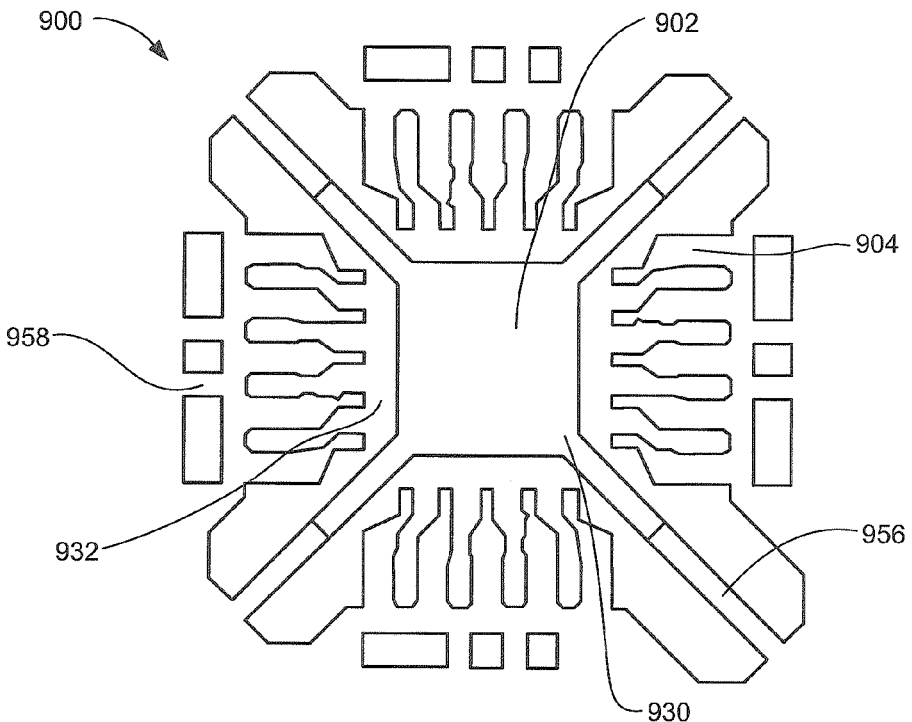
FIG. 9 is a plan view of a stacked integrated circuit package system in the embodiment of the present invention.

Referring now to FIG. 9, there is shown a plan view of a stacked integrated circuit package system 900 in the embodiment of the present invention. The plan view may be similar to plan views of the other embodiments of the present inventions, such as the first stacked integrated circuit package system 100 of FIG. 1, the third stacked integrated circuit package system 300 of FIG. 3, the fifth stacked integrated circuit package system 500 of FIG. 5, and the seventh stacked integrated circuit package system 700 of FIG. 7.

The plan view depicts a die paddle 902 punched up, leads 904, a second adhesive 930 on the die paddle 902, and tie bars 956. The tie bars 956 extend from corners of the die paddle 902. An encapsulation 932 is shown between the die paddle 902, the tie bars 956, and the leads 904. Extensions 958 attach the stacked integrated circuit package system 900 to a lead frame (not shown) having a plurality of the stacked integrated circuit package system 900.

Figure 10:
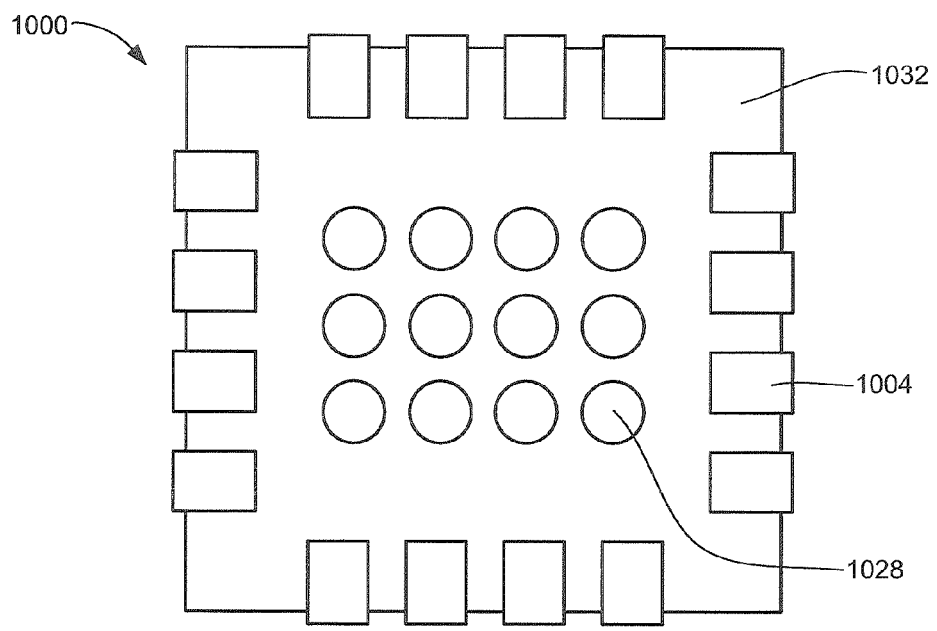
FIG. 10 is a bottom view of a stacked integrated circuit package system in an embodiment of the present invention.

Referring now to FIG. 10, there is shown a bottom view of a stacked integrated circuit package system 1000 in an embodiment of the present invention. The bottom view may be substantially the same as bottom views of the other embodiments of the present inventions, such as the first stacked integrated circuit package system 100 of FIG. 1, the third stacked integrated circuit package system 300 of FIG. 3, the fifth stacked integrated circuit package system 500 of FIG. 5, and the seventh stacked integrated circuit package system 700 of FIG. 7. The bottom view depicts leads 1004 extending from an encapsulation 1032 and second interconnects 1028 in an array configuration in an interior of the encapsulation 1032.

Figure 11:
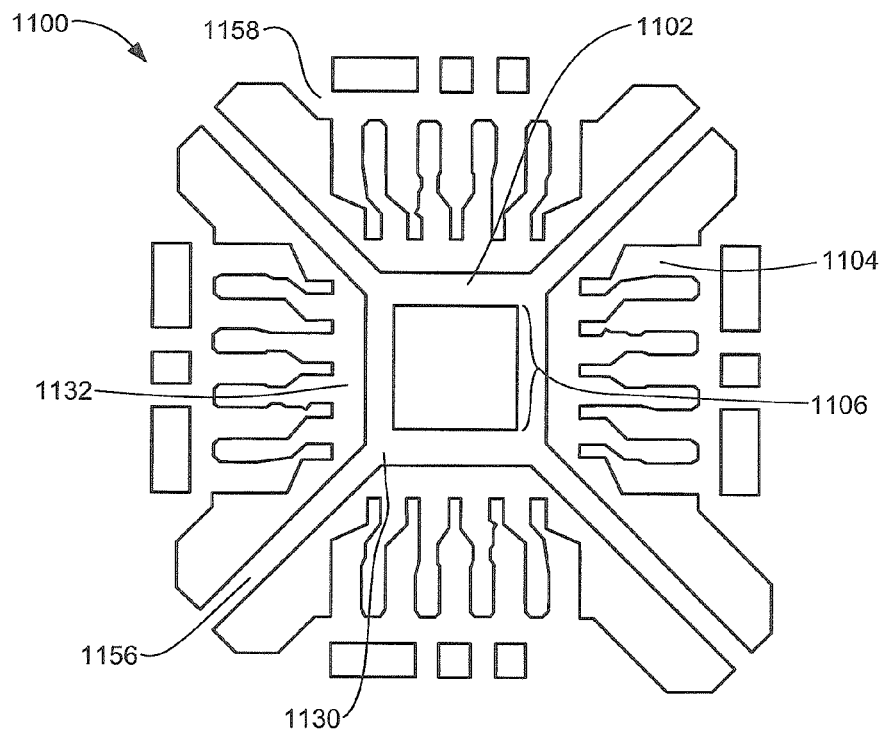
FIG. 11 is a plan view of a stacked integrated circuit package system in an alternative embodiment of the present invention.

Referring now to FIG. 11, there is shown a plan view of a stacked integrated circuit package system 1100 in an alternative embodiment of the present invention. The plan view may be similar to plan views of the other embodiments of the present inventions, such as the second stacked integrated circuit package system 200 of FIG. 2, the fourth stacked integrated circuit package system 400 of FIG. 4, the sixth stacked integrated circuit package system 600 of FIG. 6, and the eighth stacked integrated circuit package system 800 of FIG. 8.

The plan view depicts a die paddle 1102 having a center cavity 1106, leads 1104, a second adhesive 1130 on the die paddle 1102, and tie bars 1156. The tie bars 1156 extend from corners of the die paddle 1102. An encapsulation 1132 is shown between the die paddle 1102, the tie bars 1156, and the leads 1104. Extensions 1158 attach the stacked integrated circuit package system 1100 to a lead frame (not shown) having a plurality of the stacked integrated circuit package system 1100.

Figure 12:
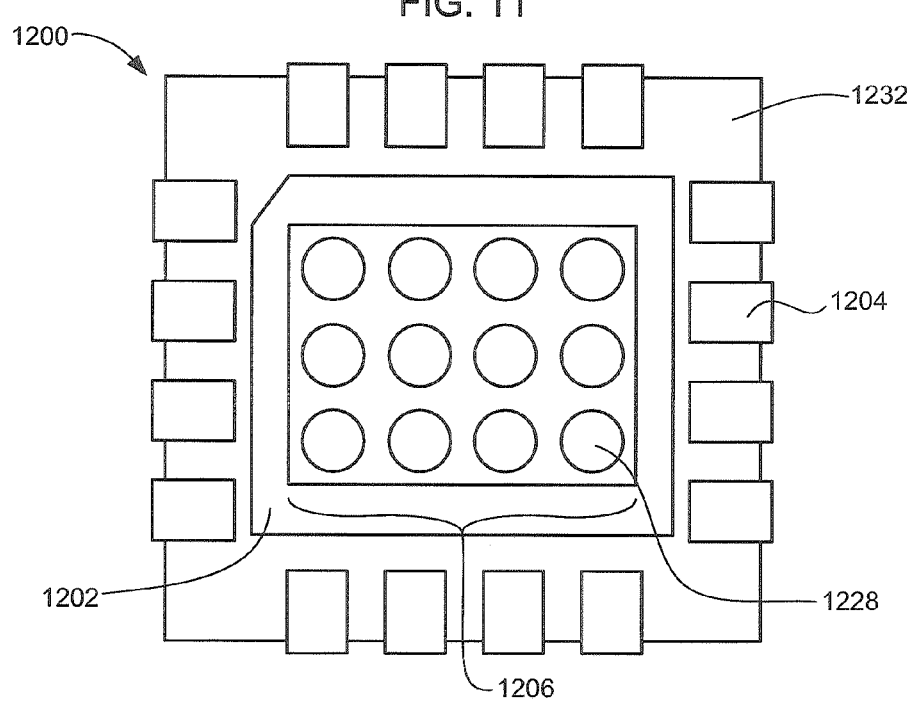
FIG. 12 is a bottom view of a stacked integrated circuit package system in an alternative embodiment of the present invention.

Referring now to FIG. 12, there is shown a bottom view of a stacked integrated circuit package system 1200 in an alternative embodiment of the present invention. The bottom view may be substantially the same as bottom views of the other embodiments of the present inventions, such as the second stacked integrated circuit package system 200 of FIG. 2, the fourth stacked integrated circuit package system 400 of FIG. 4, the sixth stacked integrated circuit package system 600 of FIG. 6, and the eighth stacked integrated circuit package system 800 of FIG. 8. The bottom view depicts leads 1204 extending from an encapsulation 1232 and second interconnects 1228 in an array configuration in a center cavity 1206 of a die paddle 1202.

Figure 13:
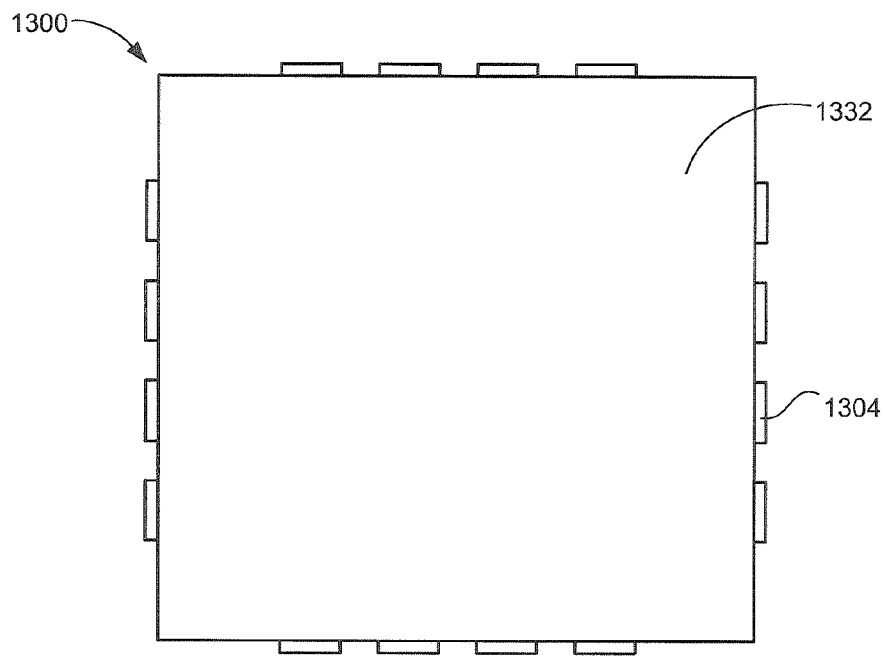
FIG. 13 is a top view of a stacked integrated circuit package system in an embodiment of the present invention.

Referring now to FIG. 13, there is shown a top view of a stacked integrated circuit package system 1300 in an embodiment of the present invention. The top view may be substantially the same as top views of the other embodiments of the present inventions, such as the first stacked integrated circuit package system 100 of FIG. 1, the second stacked integrated circuit package system 200 of FIG. 2, the fourth stacked integrated circuit package system 400 of FIG. 4, and the fifth stacked integrated circuit package system 500 of FIG. 5. The top view depicts leads 1304 extending from an encapsulation 1332.

Figure 14:
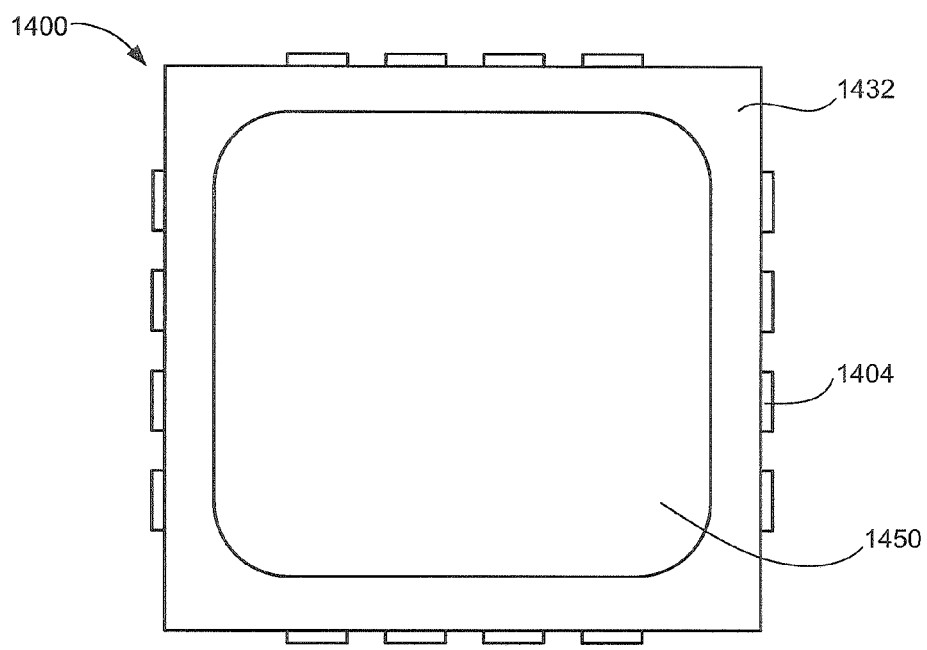
FIG. 14 is a top view of a stacked integrated circuit package system in an alternative embodiment of the present invention.

Referring now to FIG. 14, there is shown a top view of a stacked integrated circuit package system 1400 in an alternative embodiment of the present invention. The top view may be substantially the same as top views of the other embodiments of the present inventions, such as the third stacked integrated circuit package system 300 of FIG. 3, the fourth stacked integrated circuit package system 400 of FIG. 4, the seventh stacked integrated circuit package system 700 of FIG. 7, and the eighth stacked integrated circuit package system 800 of FIG. 8. The top view depicts leads 1404 extending from an encapsulation 1432 and a heat slug 1450, such as the heat slug 350 of FIG. 3, the heat slug 450 of FIG. 4, the heat slug 750 of FIG. 7, or the heat slug 850 of FIG. 8.

Figure 15:
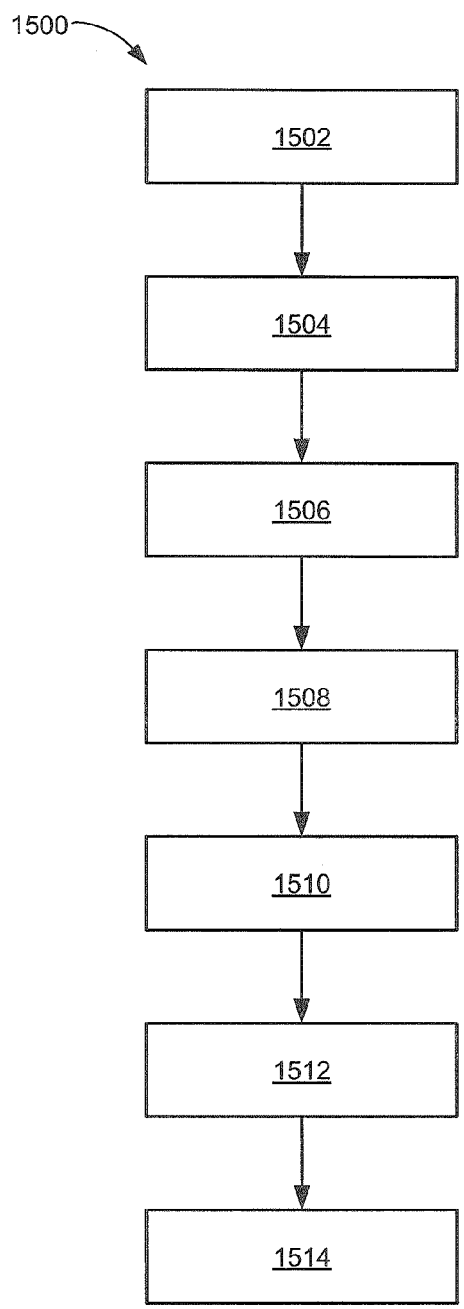
FIG. 15 is a flow chart of a manufacturing system for a first package processing system in an embodiment of the present invention.

Referring now to FIG. 15, there is shown a flow chart of a first manufacturing system 1500 for a first package processing system in an embodiment of the present invention. The first manufacturing system 1500 may manufacture a number of embodiments of the present invention, such as the first stacked integrated circuit package system 100 of FIG. 1, the third stacked integrated circuit package system 300 of FIG. 3, the fifth stacked integrated circuit package system 500 of FIG. 5, and the seventh stacked integrated circuit package system 700 of FIG. 7. The system 1500 includes inspecting a pre-bumped sawn wafer in a block 1502; applying adhesive lamination on a punch-up lead paddle in a block 1504; curing a die-attach adhesive with a logic device attached in a block 1506; flipping the lead frame strip and curing a die-attach adhesive with a power or RF device attached with an optional plasma cleaning in a block 1508; encapsulating the lead frame, the logic device, and the power or RF device with package mold curing in a block 1510; deflashing and plating of the lead bottoms and solder bumps in a block 1512; and laser marking and singulating the lead frame in a block 1514.

Figure 16:
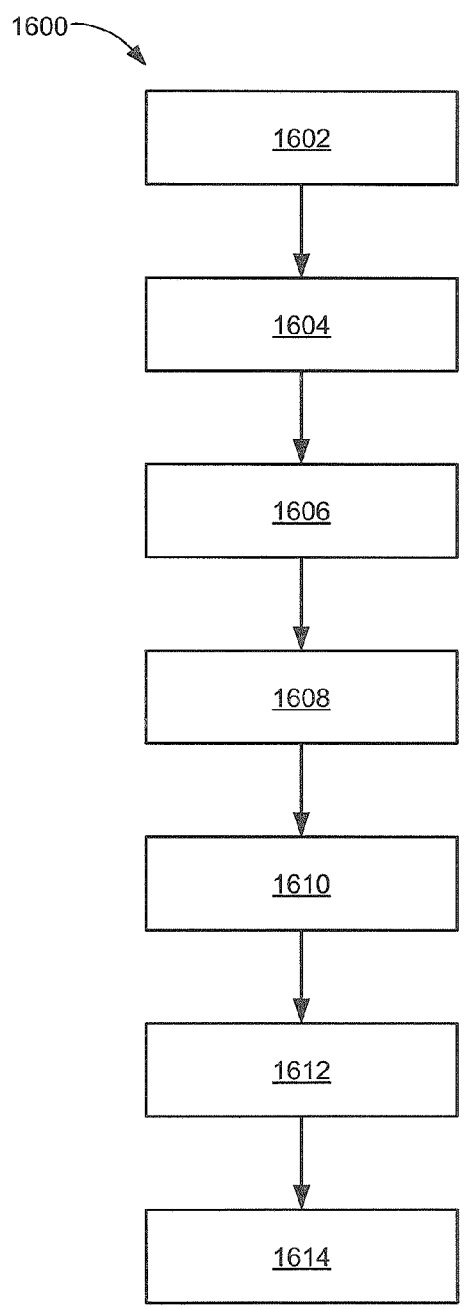
FIG. 16 is a flow chart of a manufacturing system for a second package processing system in an alternative embodiment of the present invention.

Referring now to FIG. 16, there is shown a flow chart of a second manufacturing system 1600 for a second package processing system in an alternative embodiment of the present invention. The second manufacturing system 1600 may manufacture a number of embodiments of the present invention, such as the second stacked integrated circuit package system 200 of FIG. 2, the fourth stacked integrated circuit package system 400 of FIG. 4, the sixth stacked integrated circuit package system 600 of FIG. 6, and the eighth stacked integrated circuit package system 800 of FIG. 8. The system 1600 includes inspecting a pre-bumped sawn wafer in a block 1602; curing a die-attach adhesive with a flash or logic device attached in a block 1604; applying adhesive lamination on a backside of the flash or logic device in a block 1606; curing a die-attach adhesive with a logic device attached with an optional plasma cleaning in a block 1608; flipping the lead frame strip with an optional plasma cleaning and encapsulating the lead frame, the logic device, and the flash device with package mold curing in a block 1610; deflashing and plating of the lead bottoms and solder bumps in a block 1612; and laser marking and singulating the lead frame in a block 1614.

Figure 17:
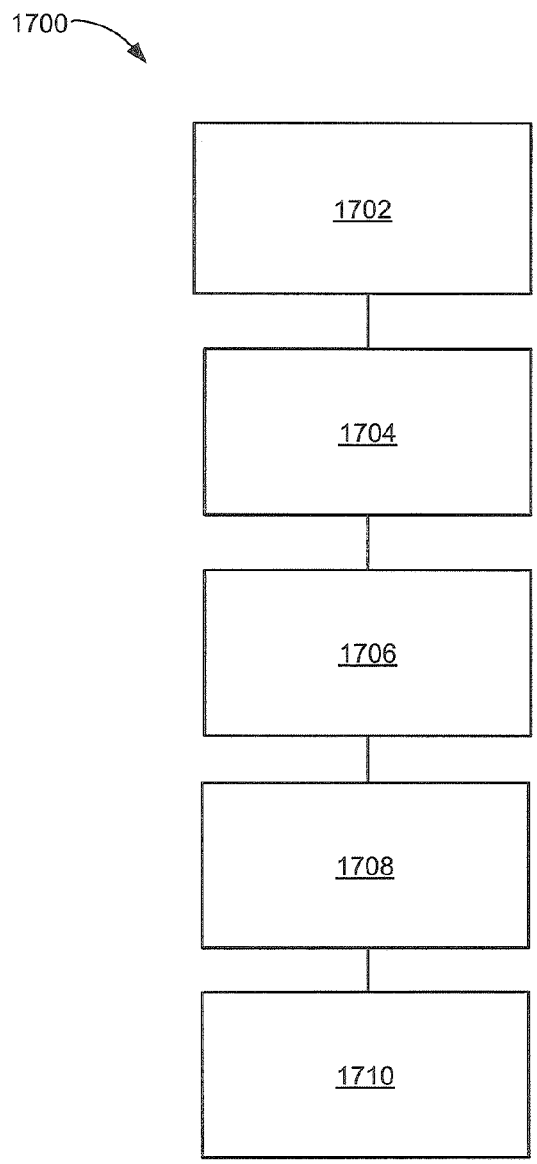
FIG. 17 is a flow chart of a stacked integrated circuit package system for the stacked integrated circuit package system in an embodiment of the present invention.

Referring now to FIG. 17, there is shown a flow chart of a stacked integrated circuit package system for the stacked integrated circuit package system in an embodiment of the present invention. The system 1700 includes forming a lead and a die paddle from a lead frame in a block 1702; forming a first integrated circuit die having an interconnect provided thereon in a block 1704; placing a second integrated circuit die over the first integrated circuit die and the die paddle in a block 1706; connecting the second integrated circuit die and the lead in a block 1708; and encapsulating the first integrated circuit die and the second integrated circuit die with a portion of the lead and the interconnect exposed in a block 1710.

It has been discovered that the present invention thus has numerous aspects.

It has been discovered that the present invention provides a low package height for stacking multiple integrated circuits of same, similar, or different functions and technologies while providing high input/output (IO) count in a minimal surface area.

An aspect is that the present invention provides the punched-up die paddle providing dual-side die-attach surfaces as well as serves as an RF shield between the integrated circuit die. Full utilization of the package bottom plane provides a dense IO count. The top integrated circuit die and the bottom integrated circuit die connect to the leads and at an inner area of a package bottom, respectively, providing the high and dense IO count. This eliminates the need for additional lead paddles to support die stacking and additional IO count.

Another aspect of the present invention is that the die paddle having the center cavity provides mounting surfaces for the integrated circuit die as well as providing space for the interconnects without imposing additional height requirements. Full utilization of the package bottom plane provides a dense IO count. The top integrated circuit die and the bottom integrated circuit die connect to the leads and through the center cavity providing the high and dense IO count. This eliminates the need for additional lead paddles to support die stacking and additional IO count.

Yet another aspect of the present invention is the option for a hybrid interconnect configuration. Both wire bonding and flip chip interconnects may be jointly used to minimize wire crossing with the bond wires at a different tier than the solder bumps.

Yet another aspect of the present invention is that the center cavity also serves as a mold lock for the solder bumps for the flip chip interface to strengthen the flip chip interconnect and suppress solder bumps/balls cracking. The lead frame coverlay tape may be eliminated for holding the first integrated circuit die.

Thus, it has been discovered that the stacked integrated circuit package system method of the present invention furnishes important and heretofore unknown and unavailable solutions, capabilities, and functional aspects for increasing chip density in systems while maintaining low package dimensions. The resulting processes and configurations are straightforward, cost-effective, uncomplicated, highly versatile and effective, can be implemented by adapting known technologies, and are thus readily suited for efficiently and economically manufacturing stacked integrated circuit packages.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method or manufacturing a stacked integrated circuit package system comprising:
    forming a lead and a die paddle from a lead frame;
    forming a first integrated circuit die having an interconnect provided thereon;
    placing a second integrated circuit die over the first integrated circuit die and the die paddle;
    connecting the second integrated circuit die and the lead; and
    molding an encapsulation on the first integrated circuit die and the second integrated circuit die with a portion of the lead and the interconnect exposed from a bottom of the encapsulation for further connection.

2. The method as claimed in claim 1 further comprising mounting the first integrated circuit die on a paddle bottom of the die paddle.

3. The method as claimed in claim 1 wherein forming the lead and the die paddle includes forming a center cavity in the die paddle.

4. The method as claimed in claim 1 further comprising:
    attaching a heat slug on a non-active side of the second integrated circuit die; and
    encapsulating the heat slug with a slug top surface of the heat slug exposed.

5. The method as claimed in claim 1 wherein:
    forming the lead and the die paddle comprises:
        forming a center cavity in the die paddle; and further comprising:
    attaching a heat slug on a non-active side of the second integrated circuit die, and
    encapsulating the heat slug with a slug top surface of the heat slug exposed.

6. A method of manufacturing a stacked integrated circuit package system comprising:
    forming a lead and a die paddle from a lead frame;
    forming a first integrated circuit die having a first interconnect provided on an active side;
    placing a second integrated circuit die over the first integrated circuit die having the active side down and the die paddle;

connecting a second interconnect between the second integrated circuit die and the lead; and molding an encansulation on the first integrated circuit die and the second integrated circuit die with a portion of the lead and the first interconnect exposed from a bottom of the encapsulation for further connection.

7. The method as claimed in claim 6 wherein connecting the second interconnect between the second integrated circuit die and the lead includes connecting a bond wire between the second integrated circuit die and the lead.

8. The method as claimed in claim 6 wherein:
forming the lead and the die paddle comprises:
forming a center cavity in the die paddle; and
connecting the second interconnect between the second integrated circuit die and the lead comprises:
connecting a bond wire between the second integrated circuit die and the lead.

9. The method as claimed in claim 6 wherein:
connecting the second interconnect between the second integrated circuit die and the lead comprises:
connecting a bond wire between the second integrated circuit die and the lead;
and further comprising:
attaching a heat slug on a non-active side of the second integrated circuit die, and
encapsulating the heat slug with a slug top surface of the heat slug exposed.

10. The method as claimed in claim 6 wherein:
forming the lead and the die paddle comprises:
forming a center cavity in the die paddle;
connecting the second interconnect between the second integrated circuit die and the lead comprises:
connecting a bond wire between the second integrated circuit die and the lead;
and further comprising:
attaching a heat slug on the second integrated circuit die, and
encapsulating the heat slug with a slug top surface of the heat slug exposed.

11. A stacked integrated circuit package system comprising:
a lead;
a die paddle adjacent to the lead;
a first integrated circuit die having an interconnect provided thereon;
a second integrated circuit die over the first integrated circuit die and the die paddle;
the second integrated circuit die connected to the lead; and
an encapsulation to cover the first integrated circuit die and the second integrated circuit die with a portion of the lead and the interconnect exposed from a bottom of the encapsulation.

12. The system as claimed in claim 11 further comprising the first integrated circuit die on a paddle bottom of the die paddle.

13. The system as claimed in claim 11 wherein the die paddle adjacent to the lead includes a center cavity in the die paddle.

14. The system as claimed in claim 11 further comprising:
a heat slug on a non-active side of the second integrated circuit die; and
the encapsulation to cover the heat slug with a slug top surface of the heat slug exposed.

15. The system as claimed in claim 11 wherein:
the die paddle adjacent to the lead comprises:
forming a center cavity in the die paddle; and further comprising:
a heat slug on a non-active side of the second integrated circuit die, and
the encapsulation to cover the heat slug with a slug top surface of the heat slug exposed.

16. The system as claimed in claim 11 wherein:
the lead has an inner lead;
the die paddle adjacent to the lead has an adhesive thereon;
the first integrated circuit die having the first interconnect provided on an active side has a solder interconnect;
the second integrated circuit die over the first integrated circuit die with the active side down and the die paddle has a second interconnect;
the second integrated circuit die connected to the lead with the second interconnect; and
the encapsulation is a cover of the first integrated circuit die and the second integrated circuit die with the portion of the lead and the first interconnect exposed from the bottom of the encapsulation includes the encapsulation covers the second interconnect.

17. The system as claimed in claim 16 wherein the second interconnect is a bond wire between the second integrated circuit die and the lead.

18. The system as claimed in claim 16 wherein:
the die paddle adjacent to the lead comprises:
a center cavity in the die paddle; and
the second interconnect further comprises:
a bond wire between the second integrated circuit die and the lead.

19. The system as claimed in claim 16 wherein:
the second interconnect comprises:
a bond wire between the second integrated circuit die and the lead; and further comprising:
a heat slug on a non-active side of the second integrated circuit die, and
the encapsulation to cover the heat slug with a slug top surface of the heat slug exposed.

20. The system as claimed in claim 16 wherein:
the die paddle adjacent to the lead comprises:
a center cavity in the die paddle;
the second interconnect comprises:
a bond wire between the second integrated circuit die and the lead; and further comprising:
a heat slug on the second integrated circuit die, and
the encapsulation to cover the heat slug with a slug top surface of the heat slug exposed.

* * * * *

UNITED STATES PATENT AND TRADEMARK OFFICE
CERTIFICATE OF CORRECTION

| | | |
|---|---|---|
| PATENT NO. | : 8,803,299 B2 | Page 1 of 1 |
| APPLICATION NO. | : 11/307904 | |
| DATED | : August 12, 2014 | |
| INVENTOR(S) | : Ong | |

It is certified that error appears in the above-identified patent and that said Letters Patent is hereby corrected as shown below:

In the Specification:

1. Column 3, line 6, delete word "diagrammatic" after "semi-diagrammatic"
2. Column 4, line 18, delete "10 count" and insert therefor --dense IO--
3. Column 4, line 22, delete "high 10" and insert therefor --high IO--

In the Claims:

4. Column 10, Claim 1, line 28, delete "method or" and insert therefor --method of--
5. Column 11, Claim 6, line 3, delete "encansulation" and insert therefor --encapsulation--

Signed and Sealed this
Seventeenth Day of May, 2016

Michelle K. Lee
*Director of the United States Patent and Trademark Office*